United States Patent
Ma et al.

(10) Patent No.: US 11,688,828 B2
(45) Date of Patent: *Jun. 27, 2023

(54) DISPLAY PANEL AND DISPLAY DEVICE

(71) Applicant: WuHan TianMa Micro-Electronics Co., Ltd., Wuhan (CN)

(72) Inventors: Yangzhao Ma, Wuhan (CN); Ruiyuan Zhou, Wuhan (CN); Yingjie Chen, Wuhan (CN)

(73) Assignee: WuHan TianMa Micro-Electronics Co., Ltd., Wuhan (CN)

( * ) Notice: Subject to any disclaimer, the term of this patent is extended or adjusted under 35 U.S.C. 154(b) by 123 days.

This patent is subject to a terminal disclaimer.

(21) Appl. No.: 17/239,663

(22) Filed: Apr. 25, 2021

(65) Prior Publication Data

US 2021/0249563 A1    Aug. 12, 2021

Related U.S. Application Data

(63) Continuation of application No. 16/729,310, filed on Dec. 28, 2019, now Pat. No. 10,991,848.

(30) Foreign Application Priority Data

Aug. 26, 2019 (CN) .......................... 201910789575.9

(51) Int. Cl.
*H01L 33/24* (2010.01)
*H01L 25/075* (2006.01)
(Continued)

(52) U.S. Cl.
CPC .......... *H01L 33/24* (2013.01); *H01L 25/0753* (2013.01); *H01L 33/62* (2013.01); *H01L 31/14* (2013.01)

(58) Field of Classification Search
CPC ..... H01L 33/24; H01L 25/0753; H01L 33/62; H01L 31/14; H01L 27/156;
(Continued)

(56) References Cited

U.S. PATENT DOCUMENTS 10,453,828 B1 * 10/2019 Ouderkirk ............. H01L 27/156
10,991,848 B2 * 4/2021 Ma .......................... H01L 33/62
(Continued)

FOREIGN PATENT DOCUMENTS

| CN | 107731099 A | 2/2018 |
| CN | 107731159 A | 2/2018 |

(Continued)

*Primary Examiner* — Victor A Mandala
(74) *Attorney, Agent, or Firm* — Kilpatrick Townsend & Stockton, LLP

(57) ABSTRACT

A display panel and a display device. The display panel includes a display area. The display area includes pixels in an array, pixels include at least three sub-pixels of different colors; display area includes a general display area, a transition display area, a photosensitive device setting area, general display area surrounds at least a part of transition display area, transition display area surrounds photosensitive device setting area; in transition display area, sub-pixels include display sub-pixels and virtual sub-pixels, sub-pixels include pixel circuits and light-emitting units, light-emitting units are electrically connected to pixel circuits in display sub-pixels, light-emitting units are insulated from pixel circuits in virtual sub-pixels; in photosensitive device setting area, sub-pixels include display sub-pixels; a setting density of display sub-pixels in transition display area is higher than that of the display sub-pixels in photosensitive device setting area, and lower than that of the display sub-pixels in general display area.

19 Claims, 10 Drawing Sheets

(51) Int. Cl.
  *H01L 33/62* (2010.01)
  *H01L 31/14* (2006.01)
(58) Field of Classification Search
  CPC ............. H01L 27/3211; H01L 27/3227; H01L 27/3234; G09G 3/3208
  See application file for complete search history.

(56) References Cited

U.S. PATENT DOCUMENTS

| | | | | |
|---|---|---|---|---|
| 2011/0242075 A1* | 10/2011 | Yamamoto | ............ | G06F 3/0421 |
| | | | | 250/208.6 |
| 2014/0354905 A1* | 12/2014 | Kitchens | ............... | G06F 3/0421 |
| | | | | 349/12 |
| 2015/0021589 A1 | 1/2015 | Chung et al. | | |
| 2018/0096186 A1* | 4/2018 | Mienko | ............... | G06V 40/1359 |
| 2018/0159088 A1* | 6/2018 | Lai | ..................... | H01L 25/0753 |
| 2019/0172390 A1 | 6/2019 | Saotome et al. | | |
| 2019/0213435 A1* | 7/2019 | Nikhara | .................. | G06V 20/64 |
| 2020/0052048 A1* | 2/2020 | Kuo | ......................... | H10K 59/65 |
| 2020/0132997 A1* | 4/2020 | Ouderkirk | ................ | G09G 3/32 |
| 2020/0142534 A1* | 5/2020 | Gu | .......................... | G06F 3/042 |
| 2020/0201117 A1* | 6/2020 | Zheng | .................. | G02B 5/0205 |
| 2020/0309702 A1* | 10/2020 | Barron | ................... | G01N 21/94 |
| 2020/0319731 A1* | 10/2020 | Yeke Yazdandoost | | ...................... H01L 31/03762 |
| 2020/0365099 A1* | 11/2020 | Lius | ................... | G09G 3/20 |
| 2021/0051254 A1* | 2/2021 | Goslin | ................... | H04N 23/55 |

FOREIGN PATENT DOCUMENTS

| | | |
|---|---|---|
| CN | 109004007 A | 12/2018 |
| CN | 208507679 U | 2/2019 |
| CN | 109950284 A | 6/2019 |
| CN | 109962092 A | 7/2019 |

* cited by examiner

DISPLAY PANEL AND DISPLAY DEVICE

CROSS-REFERENCE TO RELATED APPLICATION

This application is a continuation of U.S. patent application Ser. No. 16/729,310, filed on Dec. 28, 2019, which claims priority of Chinese Patent Application No. 201910789575.9, filed on Aug. 26, 2019, which is hereby incorporated by reference in its entirety.

FIELD

The present disclosure relates to the field of display, in particular to a display panel and a display device.

BACKGROUND

Electroluminescent displays are self-illumination devices that may realize display without backlights. Compared with liquid crystal displays, the electroluminescent displays may be made lighter and thinner without setting backlights, and thus may be applied to various scenes.

Display panels in the electroluminescent displays generally have display areas and frame areas surrounding the display areas. The frame areas may be provided with optical devices such as cameras. Due to the large size of the cameras, a large area of the frame areas is occupied, and consequently, high screen-to-body ratio and narrow frame design are limited seriously.

SUMMARY

In a first aspect, an embodiment of the present disclosure provides a display panel which includes:

a display area, and the display area includes pixels arranged in an array, and the pixels include at least three sub-pixels of different colors;

the display area includes a general display area, a transition display area and a photosensitive device setting area, the general display area surrounds at least a part of the transition display area, and the transition display area at least partially surrounds the photosensitive device setting area;

in the transition display area, the sub-pixels include display sub-pixels and virtual sub-pixels; the sub-pixels include pixel circuits and light-emitting units; the light-emitting units are electrically connected to the pixel circuits in the display sub-pixels; the light-emitting units are insulated from the pixel circuits in the virtual sub-pixels; and in the photosensitive device setting area, the sub-pixels only include the display sub-pixels.

In a second aspect, an embodiment of the present disclosure provides a display device including the display panel provided by the embodiment of the present disclosure; and the photosensitive device setting area of the display panel is provided with a camera or a fingerprint recognition device.

DETAILED DESCRIPTION OF THE EMBODIMENTS

Specific implementations of a display panel and a display device provided by the embodiments of the present disclosure will be described in detail below with reference to the accompanying drawings. It should be noted that the described embodiments are only illustrative ones of the present disclosure, and are not all possible ones of the present disclosure.

Figure 1:
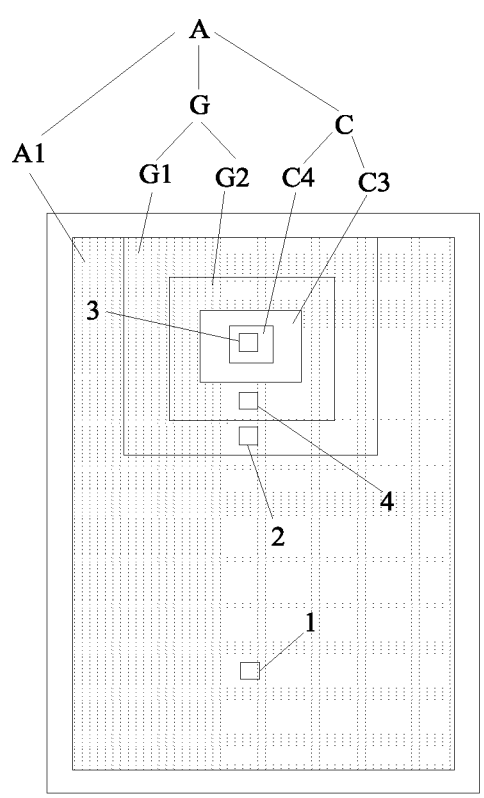
FIG. 1 is a structural diagram of a display panel provided in an embodiment of the present disclosure.
Figure 2:
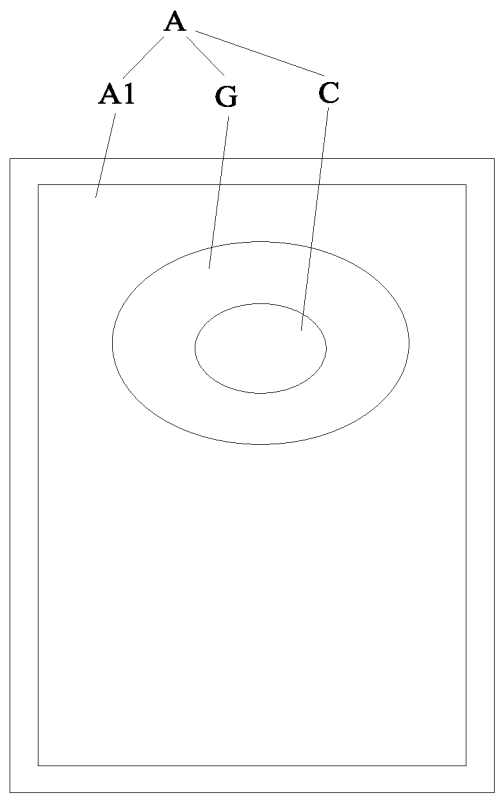
FIG. 2 is a structural diagram of another display panel provided in an embodiment of the present disclosure.
Figure 3:
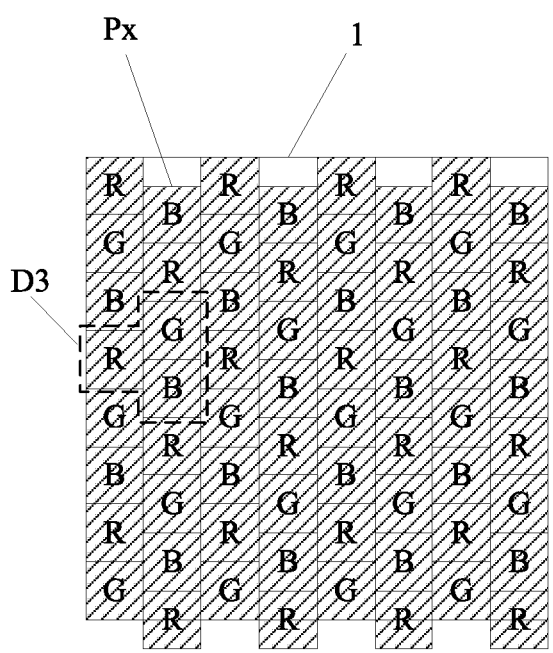
FIG. 3 is a partial enlarged schematic diagram of solid wireframe 1 in FIG. 1.
Figure 4:
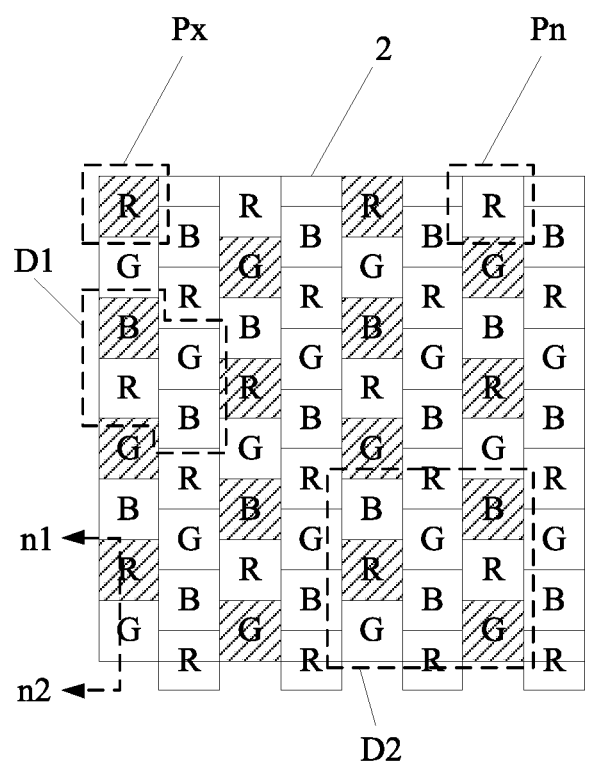
FIG. 4 is a partial enlarged schematic diagram of solid wireframe 2 in FIG. 1.
Figure 5:
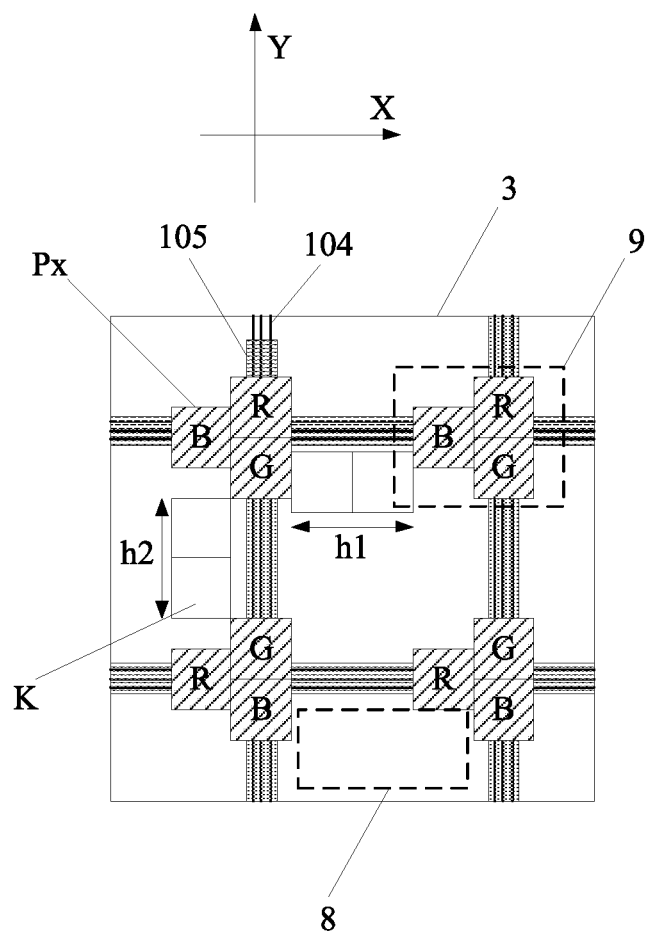
FIG. 5 is a partial enlarged schematic diagram of solid wireframe 3 in FIG. 1.
Figure 6:
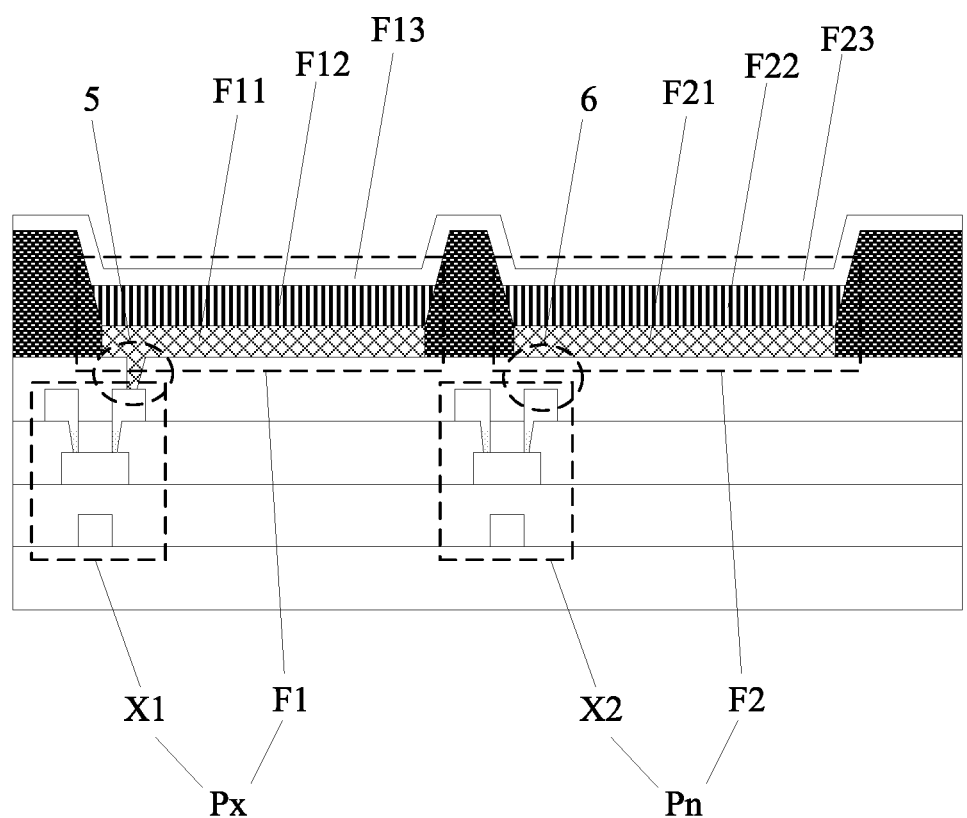
FIG. 6 is a sectional view in the n1-n2 direction in FIG. 4.

One embodiment of the present disclosure provides a display panel, as shown in FIGS. 1 to 6, and FIG. 1 is a structural diagram of one display panel, FIG. 2 is a structural diagram of another display panel, FIG. 3 is a partial enlarged schematic diagram of solid wireframe 1 in FIG. 1, FIG. 4 is a partial enlarged schematic diagram of solid wireframe 2 in FIG. 1, FIG. 5 is a partial enlarged schematic diagram of solid wireframe 3 in FIG. 1, and FIG. 6 is a sectional view in the n1-n2 direction in FIG. 4.

Referring to FIGS. 1 to 6, the display panel includes:

a display area A, and the display area A includes pixels arranged in an array, and the pixels include at least three sub-pixels of different colors (such as Px and Pn in FIG. 4); and the display area A includes a general display area A1, a transition display area G and a photosensitive device setting area C; the general display area A1 surrounds at least a part of the transition display area G, and the transition display area G surrounds the photosensitive device setting area C; as shown in FIG. 1, the general display area A1 partially surrounds the transition display area G; and as shown in FIG. 2, the general display area A1 surrounds the transition display area G.

In the transition display area G, the sub-pixels include display sub-pixels (such as the area filled with oblique lines in FIG. 4, namely Px in FIG. 4) and virtual sub-pixels (such as the white area in FIG. 4, namely Pn in FIG. 4); the sub-pixels include pixel circuits and light-emitting units, as shown in FIG. 6, F1 represents light-emitting units in the display sub-pixels Px, F2 represents light-emitting units in the virtual sub-pixels Pn, X1 represents pixel circuits in the sub-pixels Px, and X2 represents pixel circuits in the virtual sub-pixels Pn. Although only one transistor is shown in X1 and X2, this does not mean that each pixel circuit includes one transistor only. In actual cases, each pixel circuit includes a plurality of transistors. Only one transistor is adopted for indicating the pixel circuits herein.

The light-emitting units F1 are electrically connected to the pixel circuits X1 in the display sub-pixels Px (as shown by the dashed circle 5 in FIG. 6), and the light-emitting units F2 are insulated from the pixel circuits X2 in the virtual sub-pixels Pn (as shown by the dotted circle 6 in FIG. 6). In the photosensitive device setting area C, the sub-pixels only include the display sub-pixels Px (as shown in FIG. 5);

the setting density of the display sub-pixels Px in the transition display area G is higher than the setting density of the display sub-pixels Px in the photosensitive device setting area C, and is lower than the setting density of the display sub-pixels Px in the general display area A1, as shown in FIGS. 3 to 5, and FIGS. 3 to 5 show the number of display sub-pixels Px set in the areas of the same area.

In the embodiment of the present disclosure, the display area A includes a photosensitive device setting area C. When a photosensitive device is arranged in the photosensitive device setting area C, the photosensitive device will not occupy a large area when arranged on a frame, so that the frame is made narrower, thus increasing the screen-to-body ratio and achieving the narrow frame design.

In an actual case where only the general display area A1 and the photosensitive device setting area C are set, when a photosensitive device is arranged in the corresponding photosensitive device setting area C of a display device, the setting density of the display sub-pixels Px in the photosensitive device setting area C is set to be low to avoid the influence on the operation of the photosensitive device; the general display area A1 may be regarded as a normal display area, so the setting density of the display sub-pixels Px in the area is set to be high. When the difference between the setting densities of the display sub-pixels Px of the general display area A1 and the photosensitive device setting area C is large, there will be a great difference between display brightness of the general display area A1 and the photosensitive device setting area C, which may in turn result in a split screen phenomenon and bright and dark lines at the boundary between the general display area A1 and the photosensitive device setting area C, and the display effect of the display panel is reduced by these phenomena.

Therefore, in the embodiment of the present disclosure, the transition display area G is set, the general display area A1 surrounds at least a part of the transition display area G, the transition display area G surrounds the photosensitive device setting area C, and the setting density of the display sub-pixels Px in the transition display area G is higher than the setting density of the display sub-pixels Px in the photosensitive device setting area C and is lower than the setting density of the display sub-pixels Px in the general display area A1, so that the densities of the display sub-pixels Px are gradually decreased from the general display area A1, to the transition display area G and to the photosensitive device setting area C, the display brightness is sequentially lowered from the general display area A1 to the transition display area G and to the photosensitive device setting area C, split screens and bright and dark lines caused by sudden changes to brightness are avoided, the display uniformity of the display panel is improved, and thus, the display effect is improved.

It should be noted that in the embodiment of the present disclosure, in the photosensitive device setting area C, the sub-pixels only include the display sub-pixels Px because:

a photosensitive device is generally arranged in the corresponding photosensitive device setting area C of the display device, in order to guarantee normal work of the photosensitive device, light needs to be transmitted through the display panel to be transmitted to the photosensitive device, and then the photosensitive device receives light to work normally.

Meanwhile, the photosensitive device setting area C belongs to part of the display area A, and the photosensitive device setting area C also needs to display images when necessary, in order to ensure that the photosensitive device setting area C may display images and may transmit light, in the photosensitive device setting area C, if the sub-pixels only include the display sub-pixels Px and do not include the virtual sub-pixels, the display sub-pixels Px may be used for display, and gaps between the display sub-pixels Px may be set as light-transmitting areas (as shown in the dashed circle 8 in FIG. 5), thus allowing light to be transmitted.

In this way, the photosensitive device setting area C not only has a display function, but also allows light to be transmitted to guarantee normal work of the photosensitive device, thus improving the reliability of the display device.

Moreover, as for the transition display area G, a photosensitive device will not be arranged in the corresponding transition display area G of the display device, thus, a light-transmitting area does not need to be set in the transition display area G, that is, light does not need to be transmitted, and therefore, in the transition display area G, the sub-pixels may include display sub-pixels Px and virtual sub-pixels Pn, and the display sub-pixels Px are used for achieving the display function, and the virtual sub-pixels Pn are used for balancing the load on lines (such as gate lines and data lines), so that a more uniform display effect is fulfilled.

In one embodiment of the present disclosure, the orthographic projection areas of all the sub-pixels on the light-emitting surface of the display panel are the same, as shown in FIGS. 3 to 5. In this way, the structure of the display panel is simplified, thus lowering the manufacturing difficulty of the display panel and improving the production efficiency and the production yield of the display panel.

Of course, the orthographic projection areas of all the sub-pixels on the light-emitting surface of the display panel may be different.

In one embodiment, since the setting densities of the display sub-pixels in the transition display area G and the photosensitive device setting area C are lower than the setting density of the display sub-pixels in the general display area A1, in order to balance the display brightness of the transition display area G, the photosensitive device setting area C and the general display area A1, the orthographic projection areas of the display sub-pixels in different areas on the light-emitting surface of the display panel may be set from large to small as follows: the photosensitive device setting area C, the transition display area G and the general display area A1, namely, the orthographic projection area of the display sub-pixels in the photosensitive device setting area C on the light-emitting surface of the display panel is largest, the orthographic projection area of the display sub-pixels in the transition display area G on the light-emitting surface of the display panel is the secondly largest, and the orthographic projection area of the display sub-pixels in the general display area A1 on the light-emitting surface of the display panel is smallest.

In this way, the display brightness of all the areas is balanced advantageously, the display uniformity is effectively improved, and the design flexibility may be improved, thus meeting the requirements of various application scenarios.

In one embodiment of the present disclosure, the sub-pixels in the same column include different colors, and the sub-pixels in the same row include the same color, as shown in FIG. 3 and FIG. 4. In one embodiment, the sub-pixels in the same column include the same color, the sub-pixels in the same row include different colors, and no illustration is given in this case.

That is to say, the sub-pixels in each row and each column may be set as actually needed to adapt to various application scenarios, and the design flexibility may be improved.

In the following illustrative example, the sub-pixels in the same column include different colors, and the sub-pixels in the same row include the same color.

In one embodiment, the first sub-pixels in the odd-numbered column and the even-numbered column are staggered, and are not aligned, as shown in FIG. 3, for example, as for the first column and the second column from the left, the first sub-pixel in the second column is a blue sub-pixel B which is located between the first two sub-pixels of the first column (namely the red sub-pixel R and the green sub-pixel G), so that the blue sub-pixel B is located in a different row from the first two sub-pixels in the first column.

Figure 7:
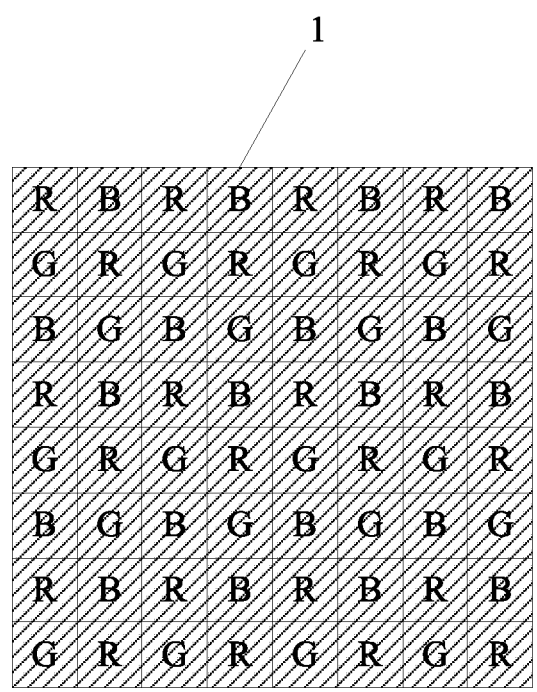
FIG. 7 is another partial enlarged schematic diagram of solid wireframe 1 in FIG. 1.

Of course, in the actual situation, the arrangement of the sub-pixels is not limited to the modes shown in FIGS. 3 to 5 and may also be in the mode shown in FIG. 7 which is another partial enlarged schematic diagram of solid wireframe 1 in FIG. 1. However, no matter how the sub-pixels are arranged, the uniformity of the display panel should be improved by the transition display area, and the arrangement of the sub-pixels is not specifically limited.

In one embodiment of the present disclosure, the photosensitive device setting area C may be elliptic as shown in FIG. 2, or square as shown in FIG. 1, or circular (not shown), or polygonal (not shown), or the like, and the present disclosure has no limitation in this aspect. The photosensitive device setting area may be set according to the shape of the photosensitive device as actually needed, so that the design flexibility is improved.

Of course, the transition display area G and the photosensitive device setting area C may be in the same shape, as shown in FIG. 1 and FIG. 2, may also be in different shapes (not shown), and may be designed as actually needed, and the present disclosure has no limitation in this aspect.

In one embodiment, at least one virtual sub-pixel Pn is arranged between at least partially adjacent two display sub-pixels Px in the transition display area G in the embodiment of the present disclosure.

In one embodiment, referring to FIG. 4 which shows eight columns and sixteen rows of sub-pixels, in the first column of sub-pixels from the left in the figure, the areas filled with oblique lines indicate the display sub-pixels, the white areas indicate the virtual sub-pixels, each red display sub-pixel R and the corresponding blue display sub-pixel B are two adjacent display sub-pixels, and a virtual sub-pixel (such as a green virtual sub-pixel G) is arranged between each red display sub-pixel R and the corresponding blue display sub-pixel B.

Figure 8:
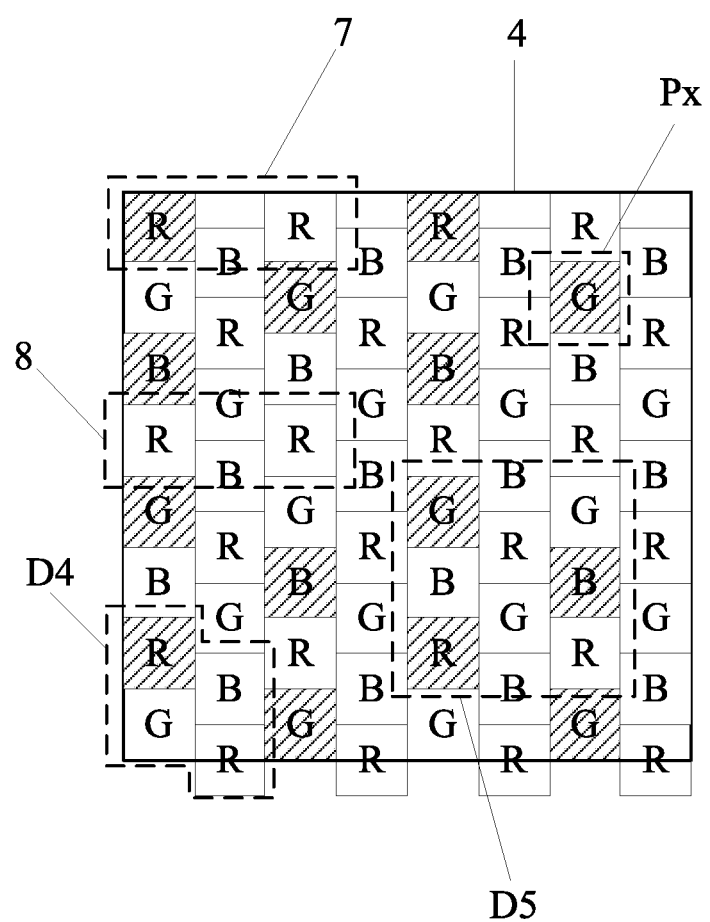
FIG. 8 is a partial enlarged schematic diagram of solid wireframe 4 in FIG. 1.

In one embodiment, referring to FIG. 8 which is a partial enlarged schematic diagram of solid wireframe 4 in FIG. 1 and shows eight columns and sixteen rows of sub-pixels, in the third column of sub-pixels from the left, the areas filled with oblique lines represent the display sub-pixels, the white areas represent the virtual sub-pixels, each green display sub-pixel G and the corresponding blue display sub-pixel B are two adjacent display sub-pixels, and three virtual sub-pixels, namely a blue virtual sub-pixel B, a red virtual sub-pixel R and a green virtual sub-pixel G, are arranged between each green display sub-pixel G and the corresponding blue display sub-pixel B.

In this way, the problem of non-uniform display caused by excessively dense arrangement of the display sub-pixels may be avoided, thus improving the display uniformity of the display panel; and meanwhile, the positions of the display sub-pixels may be set as actually needed, so that the display sub-pixels are able to adapt to various application scenarios while the design flexibility is improved.

Moreover, as shown in FIG. 4 and FIG. 8, no matter how many virtual sub-pixels are arranged between two adjacent display sub-pixels in the column direction, every two adjacent display sub-pixels in the column direction are different in color. For the general display area, the two display sub-pixels in the column direction are also different in color (as shown in FIG. 3), that is, compared with the general display area, the display sub-pixels in the transition display area are set in the same color.

In this way, the display effect of the transition display area is similar to that of the general display area, and the display uniformity may be ensured; and in addition, the image processing algorithm (such as the rendering algorithm) does not need to be greatly modified during image display, so that the computation burden and processing complexity of a driving chip are lowered, the power consumption of the driving chip is reduced, and thus the power consumption of the display device is reduced.

In one embodiment, in order to further weaken split screens and eliminate bright and dark lines, in the embodiment of the present disclosure, the transition display area G includes a first sub-area and a second sub-area, and the first sub-area surrounds the second sub-area;

the setting density of the display sub-pixels in the first sub-area is higher than the setting density of the display sub-pixels in the second sub-area.

In one embodiment, as shown in FIG. 1, G1 represents a first sub-area, G2 represents a second sub-area, the first sub-area G1 surrounds the second sub-area G2, a solid wireframe 2 is located in the first sub-area G1, a solid wireframe 4 is located in the second sub-area G2, and the partial enlarged schematic diagrams of the solid wireframe 2 and the solid wireframe 4 may be seen in FIG. 4 and FIG. 8, respectively.

It should be noted that the solid wireframe 2 and the solid wireframe 4 indicate areas of the same area, so the numbers of display sub-pixels Px set in the solid wireframe 2 and the solid wireframe 4 may reflect the densities of the display sub-pixels Px, and then the setting densities of the display sub-pixels Px in the first sub-area and the second sub-area are reflected.

In FIG. 4, the setting number of display sub-pixels Px is 16, and in FIG. 8, the setting number of display sub-pixels Px is 14. Therefore, the setting density of the display sub-pixels Px shown in FIG. 8 is lower than the setting density of the display sub-pixels Px shown in FIG. 4, and then it is reflected that the setting density of the display sub-pixels Px in the first sub-area G1 is higher than the setting density of the display sub-pixels Px in the second sub-area G2.

The transition display area G is further divided into the first sub-area G1 and the second sub-area G2, and the setting density of the display sub-pixels Px in the first sub-area G1 is higher than the setting density of the display sub-pixels Px in the second sub-area G2, so that the density of the display sub-pixels Px is gradually decreased from the general display area A1, the first sub-area G1 and the second sub-area G2 to the photosensitive device setting area C, the brightness difference between the adjacent areas is further reduced, and the display uniformity is further improved.

In one embodiment of the present disclosure, the display sub-pixels in the first sub-area and the second sub-area may be arranged in multiple manners. The following description is given with FIG. 4 and FIG. 8 as examples.

As shown in FIG. 4 and FIG. 8, as for the transition display area:

all the sub-pixel columns are divided into first sub-pixel columns and second sub-pixel columns, the first sub-pixel columns include display sub-pixels and virtual sub-pixels, the second sub-pixel columns include virtual sub-pixels, and the first sub-pixel columns and the second sub-pixel columns are arranged alternately;

referring to FIG. 4, the display sub-pixels and the virtual sub-pixels in the first sub-pixel columns in the first sub-area are alternately arranged; and the two sub-pixels located in every two adjacent first sub-pixel columns and in the same row include a display sub-pixel and a virtual sub-pixel;

referring to FIG. 8, at least one virtual sub-pixel is arranged between every two adjacent display sub-pixels in the first sub-pixel columns in the second sub-area; and the two sub-pixels located in every two adjacent first sub-pixel columns and in the same row include at least one virtual sub-pixel.

In one embodiment, as shown in FIG. 8, the first column, the third column, the fifth column and the seventh column from the left are the first sub-pixel columns, the first column and the third column from the left are taken as an example and are two adjacent first sub-pixel columns, the dashed box 7 indicates two sub-pixels which are located in the first column and the third column from the left and located in the same row, one of the two sub-pixels is a red display sub-pixel R (as shown by the area filled with oblique lines), and the other sub-pixel is a red virtual sub-pixel R (as shown by a white area). The dashed box 8 indicates two sub-pixels which are located in the first column and the third column of the left and located in the same row, and the two sub-pixels are both red virtual sub-pixels R (as shown by white areas).

For the first sub-area, when the four densely arranged sub-pixels are regarded as a first unit (as shown by the dashed box D1 in FIG. 4), only one of the sub-pixels is a display sub-pixel, and the other three sub-pixels are virtual sub-pixels, so the arrangement manner of the display sub-pixels in the first sub-area shown in FIG. 4 may be regarded as display in ¼, that is, the setting density of the display sub-pixels in the first sub-area is ¼ that of the general display area equivalently, and thus the display brightness of the first sub-area is ¼ that of the general display area.

In addition, for some of the first units, the positions of the display sub-pixels in the first units are the same. Moreover, the dashed box D2 in FIG. 4 shows that three display sub-pixels form a display pixel, and the connection lines of center points of the three display sub-pixels of the display pixel form a triangle. For the general display area, as shown in FIG. 3, the dashed box D3 shows a display pixel composed of three display sub-pixels. In one embodiment, the connection lines of center points of the three display sub-pixels also form a triangle.

That is to say, the arrangement manner of the three display sub-pixels in each display pixel of the first sub-area is similar to that of the general display area, thus, the display effect of the first sub-area is similar to that of the general display area, and the display uniformity may be ensured; and large changes to the image processing algorithms (such as a rendering algorithm) during image display may be avoided, so that the computation burden and processing complexity of the driving chip are lowered, the power consumption of the driving chip is reduced, and the power consumption of the display device is reduced.

Similarly, for the second sub-area, when the four densely arranged sub-pixels are regarded as a second unit (as shown by the dashed box D4 in FIG. 8), part of the second units are each provided with a display sub-pixel and three virtual sub-pixels, and the four sub-pixels in the remaining second units are all virtual sub-pixels. Therefore, the arrangement manner of the display sub-pixels in the second sub-area shown in FIG. 8 may be regarded as 7/32 display, that is, the setting density of the display sub-pixels in the second sub-area is 7/32 that of the display sub-pixels in the general display area equivalently, thus, the display brightness of the second sub-area is 7/32 that of the general display area, and the display brightness of the second sub-area is lower than the display brightness of the first sub-area.

Moreover, for some of the second units, the positions of the display sub-pixels in the second units are the same. Further, the dashed box D5 in FIG. 8 shows that three display sub-pixels form a display pixel, and the connection lines of center points of the three display sub-pixels in the display pixel form a triangle. For the general display area, as shown in FIG. 3, the dashed box D3 shows a display pixel composed of three display sub-pixels. In one embodiment, the connection lines of center points of the three display sub-pixels also form a triangle.

That is to say, the arrangement manner of the three sub-pixels in each display pixel of the second sub-area is similar to that of the general display area, so that the display effect of the second sub-area is similar to that of the general display area, and the display uniformity may be ensured; and large changes to the image processing algorithms (such as a rendering algorithm) during image display may be avoided, so that the computation burden and processing complexity of the driving chip are lowered, the power consumption of the driving chip is reduced, and the power consumption of the display device is reduced.

Therefore, by setting the display sub-pixels in the first sub-area and the second sub-area, the display sub-pixels may be distributed more uniformly, display of the first sub-area and the second sub-area is more uniform, thus, the display uniformity of the whole display panel is effectively improved, the power consumption of the driving chip may be reduced, and the power consumption of the display device is reduced.

Of course, the display sub-pixels in the first sub-area and the second sub-area may be arranged in other manners besides the structures shown in FIG. 4 and FIG. 8, as long as the brightness difference between all the areas may be balanced, the display uniformity is improved, and all these arrangement manners are within the protection scope of the embodiments of the present disclosure.

In one embodiment, the display sub-pixels in the photosensitive device setting area may be arranged in various manners, and the structure shown in FIG. 5 will be described below as an example.

Referring to FIG. 5, the pixels include display pixels, and each display pixel includes three display sub-pixels of different colors, such as a red display sub-pixel R, a green display sub-pixel G and a blue display sub-pixel B;

as for the photosensitive device setting area:

all the display pixels are arranged in an array, and a light-transmitting area is formed between any two adjacent display pixels, as shown by the dashed circle 8 in FIG. 5;

the minimum distance in the row direction between two adjacent display pixels in the row direction is the sum of the lengths of at least two display sub-pixels in the row direction, and the minimum distance in the column direction between two adjacent display pixels in the column direction is the sum of the lengths of at least two display sub-pixels in the column direction. In one embodiment, but not limited to, as shown in FIG. 5, K represents an area having the same area as the display sub-pixels. In the actual case, the area K is a light-transmitting area which does not actually exist, the area K is shown in FIG. 5 for illustrating the distance between two adjacent display pixels; h1 represents the minimum distance in the row direction of two adjacent display pixels in the row direction, and h1 is the sum of the lengths of the two display sub-pixels in the row direction; h2 represents the minimum distance in the column direction of two adjacent display pixels in the column direction, and h2 is the sum of the lengths of the two display sub-pixels in the column direction.

All display sub-pixels in each display pixel are divided into a first set and a second set, each first set includes two display sub-pixels in the same column, each second set includes one display sub-pixel, and all the display sub-pixels in the first sets and the display sub-pixels in the second sets are in different columns and different rows.

In one embodiment, as shown in FIG. 5, the display pixel in the dashed box 9 is taken as an example, the red display sub-pixel R and the green sub-pixel G are in the same column and form the first set, the blue display sub-pixel B forms the second set, the red display sub-pixel R, the green sub-pixel G and the blue display sub-pixel B are not in the same row, and the green sub-pixel G and the blue display sub-pixel B are not in the same column.

That is, when the dashed box 9 in FIG. 5 shows that three display sub-pixels form a display pixel, the connection lines of center points of the three display sub-pixels in the display pixel form a triangle. For the general display area, as shown in FIG. 3, the dashed box D3 shows a display pixel composed of three display sub-pixels, and in one embodiment, the connection lines of center points of the three display sub-pixels also form a triangle.

In addition, according to the arrangement manner of the display sub-pixels shown in FIG. 5, the display brightness of the photosensitive device setting area is lower than the display brightness of the second sub-area, the display brightness is sequentially lowered from the general display area, to the first sub-area, to the second sub-area and finally to the photosensitive device setting area, and uniform transition of the display brightness is achieved.

Therefore, the arrangement manner of the three display sub-pixels in the display pixel of the photosensitive device setting area is similar to that of the general display area, so that the display effect of the photosensitive device setting area is similar to that of the general display area, and the display uniformity may be ensured; and large changes to the image processing algorithm (such as a rendering algorithm) may be avoided during image display, thus, the computation burden and processing complexity of the driving chip are lowered, the power consumption of the driving chip is reduced, and the power consumption of the display device is reduced.

In addition, through the above arrangement, the display pixels may be distributed more uniformly, display of the photosensitive device setting area is more uniform, and the photosensitive device located in the area may receive light uniformly to work normally and effectively.

Of course, the display sub-pixels in the photosensitive device setting area may be arranged in other manners besides the structure shown in FIG. 5, as long as the brightness difference between all the areas may be balanced, the display uniformity is improved, and all these arrangement manners are within the protection scope of the embodiments of the present disclosure.

In one embodiment, the general display area only includes the display sub-area Px, as shown in FIG. 3. In this way, the display effect in the general display area is improved, and the display resolution is increased.

In actual cases, the display panel mentioned in the embodiments of the present disclosure may be an electroluminescent display panel. In order to achieve the display function, the electroluminescent display panel may include a polaroid (as shown by an area filled with vertical lines in FIG. 1), and the polaroid is generally arranged on a light-emitting surface of the electroluminescent display panel (not shown) to prevent light from being reflected on the surface of an electrode when external light irradiates the electrode of the electroluminescent display panel, which may otherwise lead to a negative influence on the display effect, thus improving the display contrast.

Moreover, since the photosensitive device setting area C is set in the embodiment of the present disclosure and the photosensitive device of the display device is arranged in the area, in order to increase the light transmittance of the photosensitive device setting area C and reduce the optical loss, in the embodiments of the present disclosure, as shown in FIG. 1, the photosensitive device setting area C includes a third sub-area C3 and a fourth sub-area C4, and the third sub-area C3 surrounds the fourth sub-area C4; in the case where the setting density of the display sub-pixels in the third sub-area C3 is equal to the setting density of the display sub-pixels in the fourth sub-area C4, the polaroid is provided with a through hole, the outer contour of the orthographic projection of the through hole on the light-emitting surface of the display panel coincides with the edge of the side, away from the fourth sub-area C4, of the third sub-area C3.

In one embodiment, referring to FIG. 1, the area filled with vertical lines represents a polaroid, C4 represents a fourth sub-area, C3 represents a third sub-area, and the white area surrounded by the area filled with vertical lines may be understood as the through hole of the polaroid, and the through hole coincides with the outer edge of the third sub-area C3, that is, the through hole coincides with the edge of the side, away from the fourth sub-area C4, of the third sub-area C3.

In one embodiment, when the photosensitive device is arranged in the photosensitive device setting area C, during the bonding process of the photosensitive device and the display panel, the photosensitive device may be located in the fourth sub-area C4 if the photosensitive device is not deviated; and if the photosensitive device is deviated, the orthographic projection of the photosensitive device on the display panel may overlap with the third sub-area C3.

Meanwhile, if the outer contour of the orthographic projection of the through hole of the polaroid on the light-emitting surface of the display panel coincides with the edge of the side, away from the fourth sub-area C4, of the third sub-area C3, the polaroid will not affect the photosensitive device even if the polaroid is deviated during the bonding process, to ensure that the photosensitive device may receive sufficient light to work effectively, and the reliability of the display device is improved.

In this way, by forming the through hole in the polaroid, the fourth sub-area C4 is high in light transmittance, thus, the photosensitive device may operate normally and effectively, the display panel may normally display an image, and the display effect is improved.

In one embodiment, as for the display sub-pixels in the embodiment of the present disclosure, the pixel circuits are electrically connected to the light-emitting units and thus are able to provide driving signals for the light-emitting units to enable the light-emitting units to emit light. In one embodiment, each light-emitting unit may include an anode, a light-emitting layer and a cathode, as shown in FIG. 6, the mesh area in FIG. 6 represents an anode, the area filled with vertical lines represents a light-emitting layer, the uppermost white area in the dashed box F1 represents a cathode, the dashed box F1 represents light-emitting units in the display sub-pixels Px, and X1 represents the pixel circuits in the display sub-pixels Px.

In one embodiment, for each display sub-pixel Px: the anode F11 is electrically connected to the pixel circuit X1 (through a via hole as shown by the dashed box 5 in FIG. 6), positive charges may be output to the light-emitting layer F12 through the pixel circuit X1 and the anode F11, negative charges may be output to the light-emitting layer F12 through the cathode F13, the positive charges and the negative charges are combined in the light-emitting layer F12 to generate energy which in turn excites a light-emitting material in the light-emitting layer F12 to emit light, and thus, the display function is achieved.

For a virtual sub-pixel Pn, a light-emitting unit F2 is insulated from a pixel circuit X2 (as shown by the dashed box 6 in FIG. 6), thus, driving signals may not be supplied to the light-emitting unit F2 through the pixel circuit X2, and the light-emitting unit F2 does not emit light, that is, the virtual sub-pixel Pn may be understood as a sub-pixel that is not used for display, and the display sub-pixel Px may be understood as a sub-pixel for display.

In one embodiment of the present disclosure, the virtual sub-pixels Pn may be arranged in the following modes.

Mode 1:

a light-emitting unit in a virtual sub-pixel includes an anode, a light-emitting layer and a cathode, and the anode is insulated from a pixel circuit, so that the pixel circuit is insulated from the light-emitting unit.

In one embodiment, as shown in FIG. 6, a dashed box F2 represents a light-emitting unit in a virtual sub-pixel Pn, X2 represents a pixel circuit in the virtual sub-pixel Pn, the light-emitting unit F2 includes an anode F21, a light-emitting layer F22, and a cathode F23, and the anode F21 is insulated from the pixel circuit X2 by the dashed box 6.

That is to say, when the light-emitting units are manufactured, the light-emitting units of the display sub-pixels and the virtual sub-pixels include the same structure and thus may be manufactured through the same manufacturing process. When the pixel circuits are manufactured, the pixel circuits of the display sub-pixels and the virtual sub-pixels may be of the same structure and also may be manufactured through the same manufacturing process.

It should be noted that in order to enable a pixel circuit to be electrically connected to a light-emitting unit when a display sub-pixel is manufactured, a via hole needs to be formed between a film layer where an anode of the light-emitting unit is located and a film layer where a drain of a driver transistor in the pixel circuit is located (such as a via hole shown by the dashed box 5 in FIG. 6), the anode of the light-emitting unit is electrically connected to the drain of the driver transistor in the pixel circuit. When a virtual sub-pixel is manufactured, in order to insulate a pixel circuit from a light-emitting unit, a via hole does not need to be formed between a film layer where an anode of the light-emitting unit is located and a film layer of a drain of a driver transistor in the pixel circuit is located (as shown by the dashed box 6 in FIG. 6), and thus the anode of the light-emitting unit is insulated from the drain of the driver transistor in the pixel circuit.

In this way, all the sub-pixels in the display panel may be more uniform in structure, during manufacturing of the display panel, patterns of all masks do not need to be specially designed, existing marks may be used for manufacturing, and thus mass production is achieved.

Mode 2:

a light-emitting unit in a virtual sub-pixel only includes a light-emitting layer and a cathode.

Figure 9:
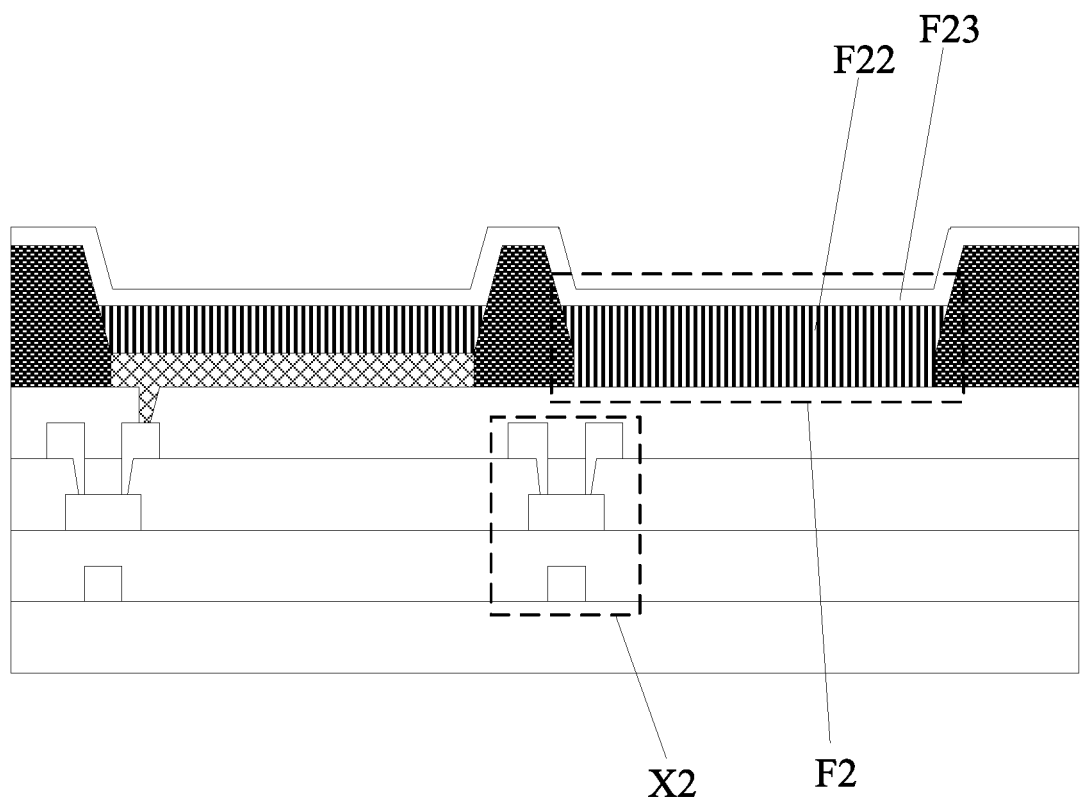
FIG. 9 is another sectional view in the n1-n2 direction in FIG. 4.

In one embodiment, as shown in FIG. 9 which is another sectional view in the n1-n2 direction in FIG. 4, the light-emitting unit F2 includes a light-emitting layer F22 and a cathode F23 and does not include an anode, and thus the light-emitting unit F2 in the virtual sub-pixel Pn is insulated from a pixel circuit X2.

Thus, the number of anodes may be reduced, the structure of the virtual sub-pixels may be simplified, the structure of the display panel may be simplified, the manufacturing difficulty of the display panel may be lowered, and the manufacturing cost of the display panel may be reduced.

Figure 10:
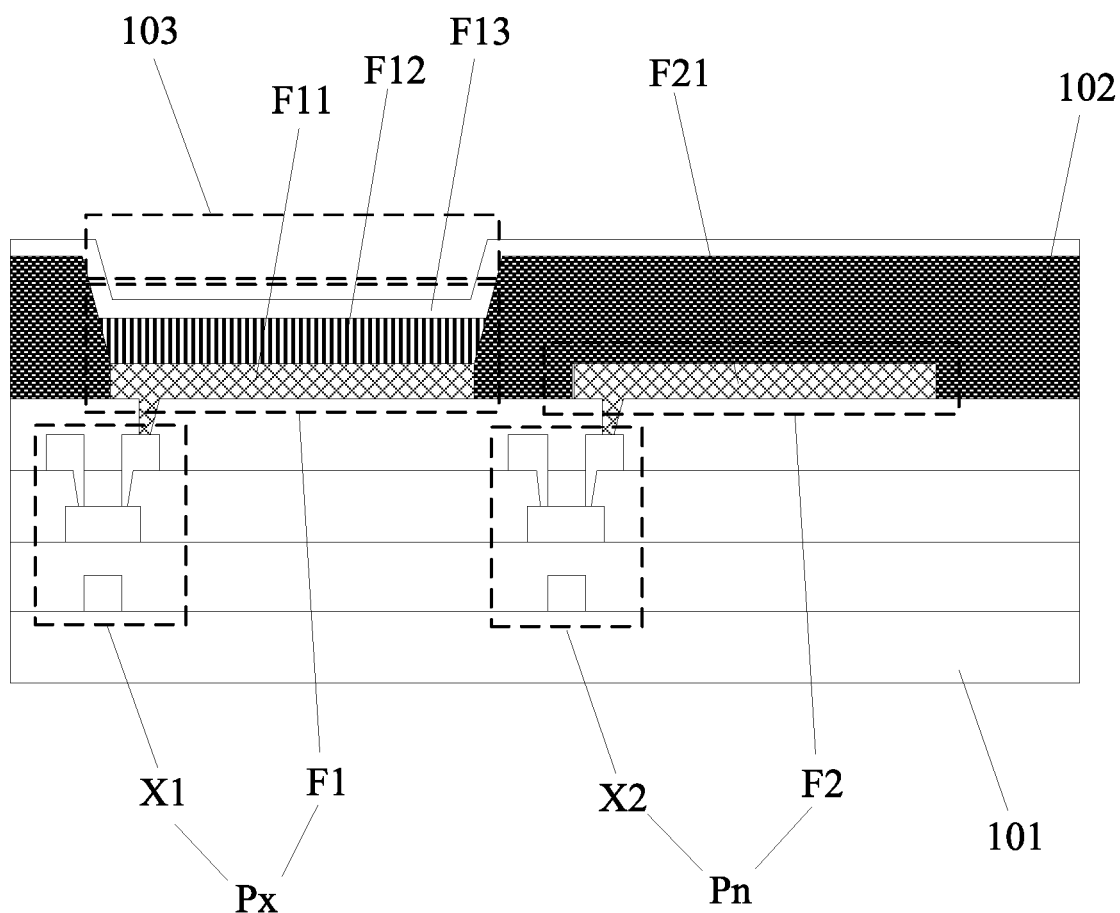
FIG. 10 is another sectional view in the n1-n2 direction in FIG. 4.

Mode 3:

as shown in FIG. 10 which is another sectional view in the n1-n2 direction in FIG. 4, the display panel further includes a base substrate 101, and pixel defining layers 102 on the base substrate 101;

the pixel defining layers 102 are provided with a plurality of opening areas 103 which coincide with the orthographic projection of the display sub-pixels Px on the base substrate 101 and do not overlap with the orthographic projection of the virtual sub-pixels Pn on the base substrate 101.

In one embodiment, in the manufacturing process of the sub-pixels, after the pixel circuits are manufactured, anodes are formed on the sides, away from the base substrate 101, of the pixel circuits, then the pixel defining layers 102 are formed, and afterwards, light-emitting layers and cathodes are sequentially formed. When the opening areas 103 do not overlap with the orthographic projections of the virtual sub-pixels Pn on the base substrate 101, the virtual sub-pixels Pn only include pixel circuits X2 and the anodes F21, and since the opening areas 103 coincide with the orthographic projections of the display sub-pixels Px on the base substrate 101, the display sub-pixels Px include the pixel circuits X1, the anodes F11, the light-emitting layers F12 and the cathodes F13.

In one embodiment, as shown in FIG. 10 which illustrates a display sub-pixel Px and a virtual sub-pixel Pn and also illustrates one of the opening areas 103 of the pixel defining layers 102, the opening area 103 is located in the area where the display sub-pixel Px is located, and the opening area 103 coincides with the orthographic projection of the display sub-pixel Px on the base substrate 101.

For the virtual sub-pixels Pn, in the area where the virtual sub-pixels Pn are located, the pixel defining layers 102 are not provided with opening areas, the anodes F21 in the virtual sub-pixels Pn are covered, and in this case, only the pixel circuits X2 and the anodes F21 exist in the area. That is, the light-emitting units F2 in the virtual sub-pixels Pn only include the anodes F21.

For the display sub-pixels Px, in the area where the display sub-pixels Px are located, the pixel defining layers 102 are provided with the opening areas 103, so that pixel circuits X1 and light-emitting units F1 are located in the area, and the light-emitting units F1 include the anodes F11, the light-emitting layers F12 and the cathodes F13.

In this way, the number of the opening areas 103 in the pixel defining layers 102 may be reduced, then the manufacturing difficulty of the pixel defining layers 102 may be lowered, and the manufacturing difficulty of the display panel is lowered accordingly; and meanwhile, the number of the light-emitting layers is reduced, so that the manufacturing cost of the display panel may be reduced.

Of course, since the opening areas 103 and the orthographic projection of the virtual sub-pixels Pn on the base substrate 101 do not overlap, the virtual sub-pixels Pn may not be provided with anodes (not shown), thus, the manufacturing difficulty of the display panel is further reduced, and the production cost of the display panel is further reduced.

In one embodiment, signal lines and light shield layers are arranged in the photosensitive device setting area in the embodiment of the present disclosure, and the lines may be understood as lines for providing signals for the display sub-pixels in the photosensitive device setting area, such as, but not limited to, gate lines, data lines and power supply voltage signal lines (such as PVDD), and the display sub-pixels in the photosensitive device setting area may be provided with corresponding signals through the lines to achieve normal display of the display sub-pixels.

The orthographic projections of the lines on the light-emitting surface of the display panel are located in the orthographic projections of the light shield layers on the light-emitting surface of the display panel.

In one embodiment, referring to FIG. 5, part of the lines 104 are illustrated and include lines 104 extending in the X direction and lines 104 extending in the Y direction, the orthographic projections of the lines 104 on the light-emitting surface of the display panel are located in the orthographic projections of the light shield layers 105 on the light-emitting surface of the display panel, so that the light shield layers 105 cover the lines 104.

In this way, the situation that normal operation of the photosensitive device located in the photosensitive device setting area C is adversely affected by diffraction caused when light irradiates the lines 104 may be avoided, thus, the operation performance of the photosensitive device may be improved, and the reliability of the display device is improved.

In one embodiment, in the embodiment of the present disclosure, the light shield layers 105 may be made of a material with a light shield function, such as a metal or an organic material with a light shield function, as long as the lines 104 are covered to be protected against light irradiation, and materials of the light shield layers 105 are not specifically limited herein.

Figure 11:
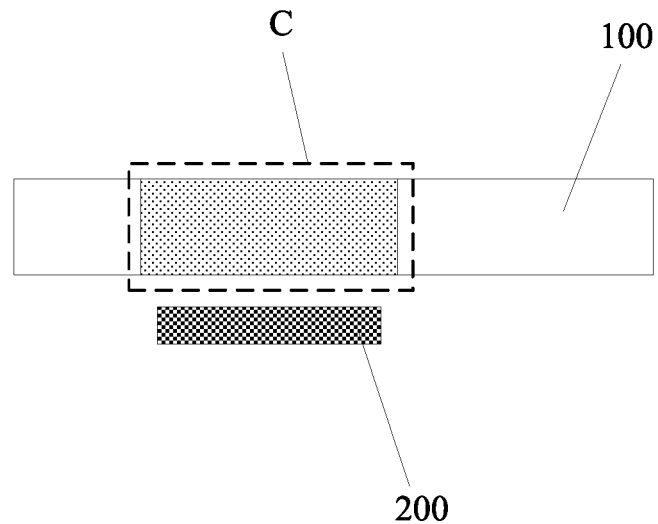
FIG. 11 is a structural diagram of a display device provided in an embodiment of the present disclosure.

Based on the same inventive concept, one embodiment of the present disclosure provides a display device. As shown in FIG. 11, the display device includes the display panel 100 provided by the embodiment of the present disclosure;

the photosensitive device setting area C of the display panel 100 is provided with a photosensitive device 200 such as a camera or a fingerprint recognition device.

Figure 12:
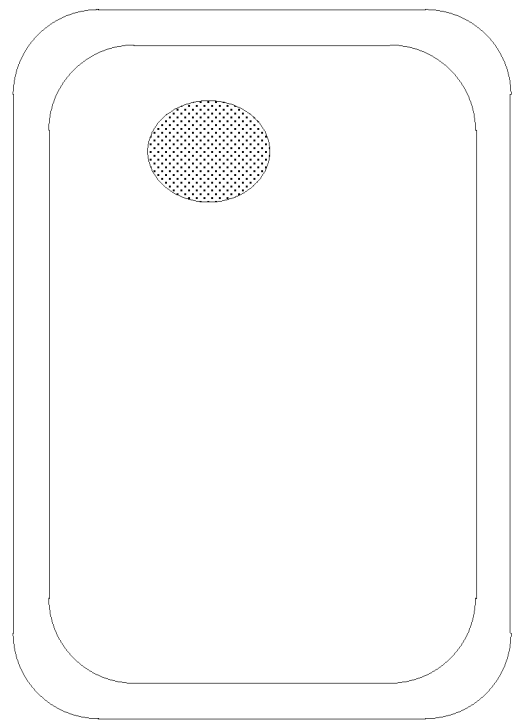
FIG. 12 is a structural diagram of another display device provided in an embodiment of the present disclosure.

In one embodiment, the display device may be any product or device with a display function, such as a mobile phone (as shown in FIG. 12), a tablet computer, a television, a display, a notebook computer, a digital photo frame or a navigator. The display device may be implemented with reference to the embodiment of the display panel, and the repeated contents are not detailed herein.

What is claimed is:

1. A display panel, comprising:

a display area, wherein the display area comprises pixels arranged in an array, and the pixels comprise at least three sub-pixels of different colors;

the display area comprises a general display area, a transition display area and a photosensitive device setting area, the general display area surrounds at least a part of the transition display area, and the transition display area at least partially surrounds the photosensitive device setting area;

in the transition display area, the at least three sub-pixels comprise display sub-pixels and virtual sub-pixels, the sub-pixels comprise pixel circuits and light-emitting units, the light-emitting units are electrically connected to the pixel circuits in the display sub-pixels, and the light-emitting units are insulated from the pixel circuits in the virtual sub-pixels; and in the photosensitive device setting area, the at least three sub-pixels only comprise display sub-pixels.

2. The display panel according to claim 1, wherein each of the light-emitting units comprises a cathode; in the transition display area, a cathode of at least one display sub-pixel and a cathode of at least one virtual sub-pixel are consecutive.

3. The display panel according to claim 1, wherein at least one virtual sub-pixel is arranged between each two display sub-pixels which are at least partially adjacent in the transition display area.

4. The display panel according to claim 1, wherein a setting density of the display sub-pixels in the transition display area is higher than a setting density of the display sub-pixels in the photosensitive device setting area, and lower than a setting density of the display sub-pixels in the general display area.

5. The display panel according to claim 4, wherein the transition display area comprises a first sub-area and a second sub-area, and the first sub-area surrounds the second sub-area;

a setting density of the display sub-pixels in the first sub-area is higher than a setting density of the display sub-pixels in the second sub-area.

6. The display panel according to claim 5, wherein for the transition display area:

all sub-pixel columns are divided into first sub-pixel columns and second sub-pixel columns, the first sub-pixel columns comprise the display sub-pixels and the virtual sub-pixels, the second sub-pixel columns comprise the virtual sub-pixels, and the first sub-pixel columns and the second sub-pixel columns are alternately arranged;

in the first sub-pixel columns in the first sub-area, the display sub-pixels and the virtual sub-pixels are alternately arranged; and two of the sub-pixels respectively located in two adjacent first sub-pixel columns and in a same row comprise one display sub-pixel and one virtual sub-pixel;

in the first sub-pixel columns in the second sub-area, at least one virtual sub-pixel is arranged between two adjacent display sub-pixels; and two of the sub-pixels located in two adjacent first sub-pixel columns and in a same row comprise at least one virtual sub-pixel.

7. The display panel according to claim 1, wherein the pixels comprise display pixels, and each of the display pixels comprises three display sub-pixels of different colors;

for the photosensitive device setting area:
all the display pixels are arranged in an array, and a light-transmitting area is formed between any two adjacent display pixels;
a minimum distance in a row direction between two adjacent display pixels in the row direction is a sum of lengths of at least two display sub-pixels in the row direction, and a minimum distance in a column direction between two adjacent display pixels in the column direction is a sum of lengths of at least two display sub-pixels in the column direction;
all of the display sub-pixels in each of the display pixels are divided into a first set and a second set, the first set comprises two of the display sub-pixels in a same column, the second set comprises one of the display sub-pixels, and all the display sub-pixels in the first set and the display sub-pixels in the second set are in different columns and different rows.

8. The display panel according to claim 1, wherein the photosensitive device setting area comprises a third sub-area and a fourth sub-area, the third sub-area surrounds the fourth sub-area, and a setting density of the display sub-pixels in the third sub-area is equal to a setting density of the display sub-pixels in the fourth sub-area;

the display panel comprises a polaroid provided with a through hole, an outer contour of an orthographic projection of the through hole on a light-emitting surface of the display panel coincides with an edge of a side, away from the fourth sub-area, of the third sub-area.

9. The display panel according to claim 1, wherein a light-emitting unit in at least one of the virtual sub-pixels comprises an anode, a light-emitting layer and a cathode, and the anode is insulated from the pixel circuit.

10. The display panel according to claim 1, wherein a light-emitting unit in at least one of the virtual sub-pixels only comprises a light-emitting layer and a cathode.

11. The display panel according to claim 1, wherein each of the light-emitting unit in the display sub-pixels comprises an anode, a light-emitting layer and a cathode, each of the light-emitting units in the virtual sub-pixels comprises a cathode.

12. The display panel according to claim 11, further comprises a base substrate and pixel defining layers located on the base substrate;

the pixel defining layers are provided with a plurality of opening areas, the opening areas coincide with orthographic projections of the display sub-pixels on the base substrate and do not overlap with orthographic projections of the virtual sub-pixels on the base substrate.

13. The display panel according to claim 1, wherein signal lines and light shield layers are arranged in the photosensitive device setting area; and orthographic projections of the lines on the light-emitting surface of the display panel are located in orthographic projections of the light shield layers on the light-emitting surface of the display panel.

14. The display panel according to claim 1, wherein the at least three sub-pixels in a same column of sub-pixels comprise different colors, and the at least three sub-pixels in a same row of sub-pixels comprise a same color; or
the at least three sub-pixels in a same column of sub-pixels comprise a same color, and the at least three sub-pixels in a same row of sub-pixels comprise different colors.

15. A display device, comprising:
a display panel, wherein:
the display panel comprises a display area, wherein the display area comprises pixels arranged in an array, and the pixels comprise at least three sub-pixels of different colors;
the display area comprises a general display area, a transition display area and a photosensitive device setting area, the general display area surrounds at least a part of the transition display area, and the transition display area at least partially surrounds the photosensitive device setting area;
in the transition display area, the at least three sub-pixels comprise display sub-pixels and virtual sub-pixels, the sub-pixels comprise pixel circuits and light-emitting units, the light-emitting units are electrically connected to the pixel circuits in the display sub-pixels, and the light-emitting units are insulated from the pixel circuits in the virtual sub-pixels; and in the photosensitive device setting area, the at least three sub-pixels only comprise display sub-pixels;
wherein the photosensitive device setting area of the display panel is provided with a camera or a fingerprint recognition device.

16. The display device according to claim 15, wherein a light-emitting unit in at least one of the virtual sub-pixels comprises an anode, a light-emitting layer and a cathode, and the anode is insulated from the pixel circuit.

17. The display device according to claim 15, wherein a light-emitting unit in at least one of the virtual sub-pixels only comprises a light-emitting layer and a cathode.

18. The display device according to claim 15, wherein each of the light-emitting unit in the display sub-pixels comprises an anode, a light-emitting layer and a cathode, each of the light-emitting units in the virtual sub-pixels comprises a cathode.

19. The display device according to claim 18, wherein the display panel further comprises a base substrate and pixel defining layers located on the base substrate;

the pixel defining layers are provided with a plurality of opening areas, the opening areas coincide with orthographic projections of the display sub-pixels on the base substrate and do not overlap with orthographic projections of the virtual sub-pixels on the base substrate.

* * * * *